United States Patent
Conn et al.

(10) Patent No.: US 8,541,884 B2
(45) Date of Patent: Sep. 24, 2013

(54) THROUGH-SUBSTRATE VIA HAVING A STRIP-SHAPED THROUGH-HOLE SIGNAL CONDUCTOR

(75) Inventors: Robert O. Conn, Laupahoehoe, HI (US); David F. Myers, Cary, NC (US); Daniel S. Stevenson, Chapel Hill, NC (US)

(73) Assignee: Research Triangle Institute, Research Triangle Park, NC (US)

( * ) Notice: Subject to any disclaimer, the term of this patent is extended or adjusted under 35 U.S.C. 154(b) by 0 days.

(21) Appl. No.: 13/535,377

(22) Filed: Jun. 28, 2012

(65) Prior Publication Data
US 2013/0009322 A1    Jan. 10, 2013

Related U.S. Application Data

(60) Provisional application No. 61/571,881, filed on Jul. 6, 2011.

(51) Int. Cl.
*H01L 23/52* (2006.01)
*H01L 23/48* (2006.01)
*H01L 29/40* (2006.01)

(52) U.S. Cl.
USPC ............ 257/774; 257/E23.011; 257/621; 257/773; 257/786; 438/612; 438/667; 361/792

(58) Field of Classification Search
USPC ........... 257/E21.59, E21.577, E23.011, 257/E23.145, 621, 698, 736, 750, 752, 758, 257/773, 774, 786; 438/106–108, 612, 620, 438/622, 667; 361/792–795
See application file for complete search history.

(56) References Cited

U.S. PATENT DOCUMENTS

| | | | | |
|---|---|---|---|---|
| 3,739,469 | A  * | 6/1973 | Dougherty, Jr. | 29/852 |
| 4,543,715 | A  * | 10/1985 | Iadarola et al. | 29/852 |
| 5,811,799 | A  * | 9/1998 | Wu | 250/239 |
| 6,137,064 | A  * | 10/2000 | Kiani et al. | 174/266 |
| 6,388,208 | B1 * | 5/2002 | Kiani et al. | 174/266 |
| 6,787,710 | B2 * | 9/2004 | Uematsu et al. | 174/261 |
| 6,891,272 | B1 * | 5/2005 | Fjelstad et al. | 257/774 |
| 6,943,056 | B2 * | 9/2005 | Nemoto | 438/106 |
| 7,204,018 | B2 * | 4/2007 | Kwong et al. | 29/837 |
| 7,335,967 | B2 * | 2/2008 | Watanabe | 257/536 |
| 7,830,018 | B2 | 11/2010 | Lee | 257/774 |
| 2005/0133251 | A1* | 6/2005 | Chiu | 174/259 |
| 2006/0180941 | A1* | 8/2006 | Kirby et al. | 257/774 |
| 2009/0057912 | A1* | 3/2009 | Kheng | 257/774 |

* cited by examiner

*Primary Examiner* — Chris Chu
(74) *Attorney, Agent, or Firm* — Imperium Patent Works; T. Lester Wallace; Darien K. Wallace

(57) ABSTRACT

A TSV structure suitable for high speed signal transmission includes a metal strip portion that extends through a long and small diameter hole in a substrate. In one example, the metal strip portion is formed by laser ablating away portions of a metal sheath that lines a cylindrical sidewall of the hole, thereby leaving a longitudinal section of metal that is the metal strip portion. A second metal strip portion, that extends in a direction perpendicular to the hole axis, is contiguous with the metal strip portion that extends through the hole such that the two metal strip portions together form a single metal strip. Throughout its length, the single metal strip has a uniform width and thickness and therefore can have a controlled and uniform impedance. In some embodiments, multiple metal strips pass through the same TSV hole. In some embodiments, the structure is a coaxial TSV.

24 Claims, 8 Drawing Sheets

TSV HAVING A STRIP-SHAPED SIGNAL CONDUCTOR
(CROSS-SECTIONAL PERSPECTIVE VIEW)

**PACKAGED INTEGRATED CIRCUIT STRUCTURE
(WITHOUT ENCAPSULANT)**

PACKAGED INTEGRATED CIRCUIT STRUCTURE

INTERPOSER WITHIN THE INTEGRATED CIRCUIT PACKAGE

THROUGH SUBSTRATE VIA HAVING A STRIP-SHAPED
SIGNAL CONDUCTOR

TSV HAVING A STRIP-SHAPED SIGNAL CONDUCTOR
(TOP-DOWN VIEW)

TSV HAVING A STRIP-SHAPED SIGNAL CONDUCTOR
(CROSS-SECTIONAL PERSPECTIVE VIEW)

TSV HAVING A STRIP-SHAPED SIGNAL CONDUCTOR
(CROSS-SECTIONAL VIEW)

TSV HAVING MULTPLE STRIP-SHAPED SIGNAL CONDUCTORS

TSV HAVING MULITPLE STRIP-SHAPED SIGNAL CONDUCTORS
(TOP-DOWN VIEW)

TSV HAVING A CO-AXIAL SIGNAL CONDUCTOR

TSV HAVING A CO-AXIAL SIGNAL CONDUCTOR
(TOP-DOWN VIEW)

SILICON CIRCUIT BOARD ASSEMBLY

THROUGH-SUBSTRATE VIA HAVING A STRIP-SHAPED THROUGH-HOLE SIGNAL CONDUCTOR

CROSS REFERENCE TO RELATED APPLICATIONS

This application claims the benefit under 35 U.S.C. §119 of provisional application Ser. No. 61/571,881, entitled "Through-Substrate Via Having a Strip-Shaped Through-Hole Signal Conductor", filed Jul. 6, 2011. The subject matter of provisional application Ser. No. 61/571,881 is incorporated herein by reference.

TECHNICAL FIELD

The described embodiments relate to a Through-Substrate Vias (TSVs).

BACKGROUND INFORMATION

Within typical electronic devices, multiple integrated circuits and other electronic components are mounted to and are interconnected by one or more Printed Circuit Boards (PCBs). The integrated circuits and electronic components are typically solder-mounted to the PCB such that signal conductors of a PCB form individual electrical connections between selected terminals of the integrated circuits and selected terminals of the other components. The signal conductors are disposed on one or more insulative substrate layers of a material such as FR4 glass reinforced epoxy laminate fiberglass. In some applications, however, finer geometry signal conductors are needed. In such applications, the fine geometry lithography and semiconductor processing technology used to fabricate integrated circuits is employed to make a substrate having fine geometry signal conductors. In some cases, structures referred to as Through Silicon Vias (TSV) extend all the way through the substrate so that electrical connections can be made from one major planar side of the substrate, perpendicularly through the substrate, and to the opposite major planar side of the substrate. A Silicon Circuit Board (SiCB) and an interposer are examples of two such substrate structures that may involve TSVs and fine geometry signal conductors. Methods and structures for improving such substrate structures are sought.

SUMMARY

A Through-substrate via (TSV) structure is suitable for high speed signal transmission in a structure such as in an interposer or in a Silicon Circuit Board. The TSV structure includes a metal strip portion that extends through a relatively long and relatively small diameter hole. A method of forming the TSV structure starts with a substrate layer having a hole. A cylindrical metal sheath lines an inside cylindrical sidewall surface of this hole. The substrate layer may, for example, include a layer of monocrystalline semiconductor material having a first major surface disposed in a first plane, and a second major surface disposed in a second plane, where the first and second planes are parallel to one another and are separated by more than seventy-five microns. The hole extends all the way through this monocrystalline semiconductor layer for a distance of more than seventy-five microns from the first plane to the second plane. In one example, the hole is a small diameter hole having a diameter of less than one hundred microns.

In a step of the method, a laser such as a high energy pulsed UV excimer laser can bore small diameter holes and/or channels (for example, five microns in width) into the constituent materials of the substrate layer. This laser is used to laser ablate away parts of the cylindrical metal sheath that lines the inside of the hole, thereby leaving a metal strip portion of uniform width that extends vertically down the hole. The metal strip portion is a longitudinal slice of the tubular metal sheath. In one example, the vertically extending metal strip portion in the hole has a uniform width of less than ten microns. In the resulting structure, a first metal strip portion extends in a first direction perpendicular to an axis of the hole. This first metal strip portion may, for example, be disposed on an upper or lower surface of the overall substrate layer and may also be formed by laser ablation. This first metal strip portion is contiguous with the vertically extending metal strip portion that extends along a sidewall of the hole. The vertically extending metal strip portion is a second metal strip portion. The first and second metal strip portions together form a single metal strip of substantially uniform width and thickness. The metal strip of the resulting TSV structure may have a controlled impedance in the ten to twenty ohm range throughout the length of the metal strip. Throughout its length, the metal strip may be separated from underlying parts of the substrate layer by a thin layer of insulative material of uniform thickness. The TSV structure sees use in numerous applications and structures including use in interposers and in Silicon Circuit Boards.

In a second novel aspect, a TSV structure includes multiple such vertically extending metal strip portions. A first of the vertically extending metal strip portions is a part of a first metal strip of uniform width and thickness. The first metal strip extends in a direction perpendicular to an axis of the hole, and then turns approximately ninety degrees and extends through the hole in a direction parallel to the axis of the hole. A second of the vertically extending metal strip portions is a part of a second metal strip of uniform width and thickness. The second metal strip extends in a direction perpendicular to an axis of the hole, and then turns approximately ninety degrees and extends through the hole in a direction parallel to the axis of the hole. The TSV structure can involve two or more such metal strips that extend through the hole in parallel to one another. The hole through which these metal strips pass need not be of a circular cross-section, but rather can have another cross-sectional shape such as, for example, a race track shape or a rectangular shape.

In a third novel aspect, the hole when considered in cross-section has a ledge. The ledge sticks out from a substantially circular sidewall of the hole into the center area of the hole. The vertically extending conductor of the TSV structure extends axially through the hole on an end surface of this ledge. Much of the remaining inside surface of the hole forms of a substantially tubular inside sidewall surface. The portion of the metal sheath that lines the inside surface of the substantially tubular inside sidewall forms a substantially tubular metal layer. In one example, the substantially tubular metal on the inside sidewall of the hole defines a circular arc of more than one hundred eighty degrees when the TSV structure is considered in cross-section. Laser ablation is used to separate this substantially tubular metal layer from the vertically extending metal strip portion on the end surface of the ledge. After laser ablation, the vertically extending metal strip portion extends down the center of the substantially tubular metal layer such that the vertically extending metal strip portion on the ledge and the surrounding substantially tubular metal layer together form a coaxial TSV signal conducting structure.

Further details and embodiments are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 1:
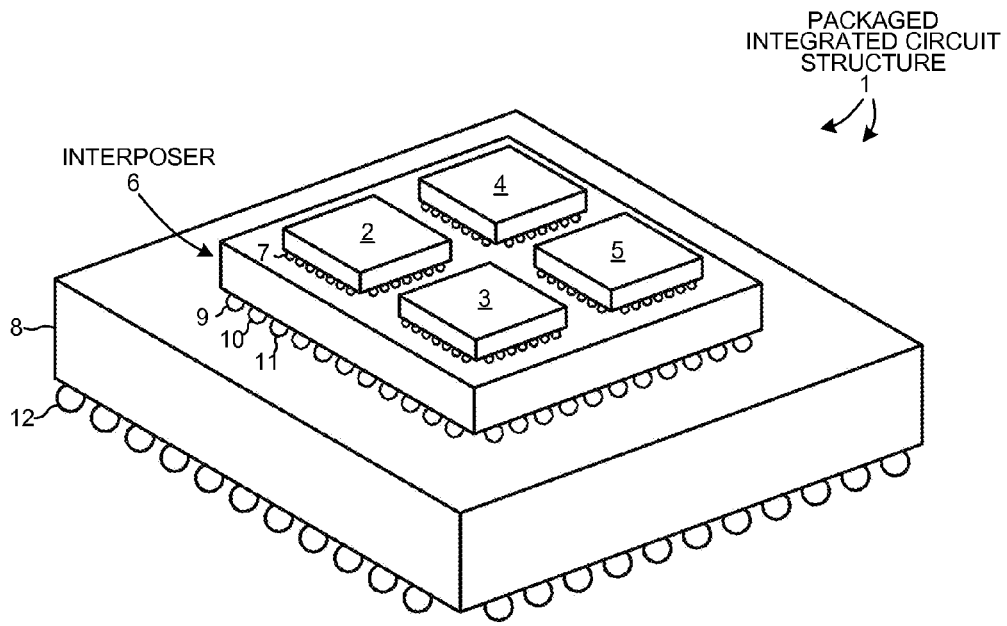
FIG. 1 is a simplified perspective view of a packaged integrated circuit structure that includes a TSV structure in accordance with one novel aspect.

FIG. 1 is a perspective view of a packaged integrated circuit structure 1 often referred to as an integrated circuit or a packaged integrated circuit. Structure 1 is sometimes referred to a multi-chip module because it includes multiple integrated circuit chips. A cap, such as a cap of a layer of conformal resin encapsulant, is generally provided and covers the top of the structure illustrated. Other types of caps can be provided. The cap is not shown in the diagram so that the electronic components 2-5 within the structure 1 can be seen. Electronic components 2-5 may include integrated circuit dice, discrete electronic components such as inductors and resistors and capacitors, and/or other electronic components. In the illustrated example, electronic components 2-5 are integrated circuit dice 2-5 that are die-bonded in flip-flip surface mount fashion by microbumps to corresponding registering bond pads on the upper surface of an interposer 6. Reference numeral 7 identifies one such microbump disposed on the bottom of integrated circuit 2. Interposer 6 is electrically and mechanically connected by larger C4 bond bumps to corresponding bond pads on the upper surface of a substrate 8. Reference numerals 9-11 identify three of these C4 bumps. The packaged integrated circuit structure 1 further includes an array of bond balls disposed on a bottom surface of substrate 8. These bond balls are used to solder-mount the packaged integrated circuit structure 1 to a printed circuit board (not shown). Reference numeral 12 identifies one such bond ball.

Figure 2:
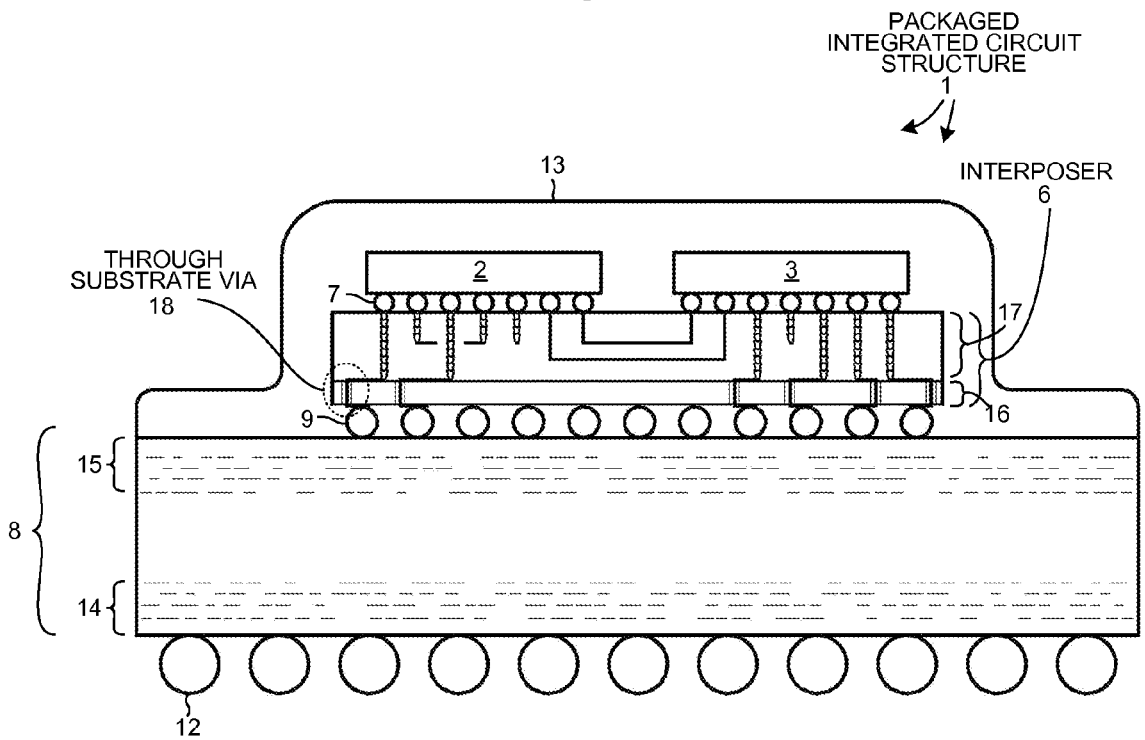
FIG. 2 is a simplified cross-sectional diagram of the packaged integrated circuit structure of FIG. 1.

FIG. 2 is a simplified cross-sectional diagram of the structure 1 of FIG. 1. Reference numeral 13 identifies the conformal cap that is not shown in FIG. 1. Substrate 8 includes first interconnect portion 14 of embedded conductors and a second interconnect portion 15 of embedded conductors. Substrate 8 may, for example, be a small FR4 printed circuit board or a small ceramic structure with embedded conductors. The layers of conductors within substrate 7 can be disposed in many different suitable ways and in fewer or more layers. The example illustrated in FIG. 2 is just one possible example. For each of the C4 bumps on the bottom of interposer 6, there is a corresponding and registering bond pad on the upper surface of the substrate 8. Individual ones of the bond balls on the bottom surface of the substrate 8 are electrically connected to individual ones of the bond pads on the upper surface of substrate 8 through the conductors of the substrate.

Interposer 6 involves a substrate layer 16 and an interconnection layer 17. Certain individual ones of the C4 bumps on the bottom of the interposer 6 are electrically connected through interposer 6 to individual ones of the microbumps on the bottoms of dice 2-5. Others of the C4 bumps are electrically connected through the interposer 6 to others of the C4 bumps. Certain individual ones of the microbumps of dice 2-5 are electrically connected through the interposer 6 to other certain individual ones of the microbumps of dice 2-5. In this way, signal, power and ground connections are made through the interposer 6. In the illustrated example, C4 bump 9 is electrically connected to microbump 7 through an electrical connection and signal path involving a Through-Substrate Via (TSV) 18. The term "Through-Substrate Via" is used here rather than the more commonly used "Through Silicon Via" because the substrate need not be silicon, but rather can be another material or materials.

In the illustrated example, substrate layer 16 involves a thin layer of monocrystalline silicon that was a part of a silicon wafer. Interconnection layer 17 is a multi-layer structure of insulating dielectric layers and metal conductor layers. Conductive interlayer metal plugs are provided to interconnect the layers of conductors together where appropriate. The metal bond pads on the upper surface of layer 17 are part of the upper layer of metal interconnect. The constituent dielectric and metal conductor layers of layer 17 are formed by depositing and patterning layer after layer on the top of substrate layer 17 using fine geometry photolithographic and semiconductor processing steps used to make integrated circuits. Interposer 6 may, but typically does not, include active electrical devices.

Figure 3:
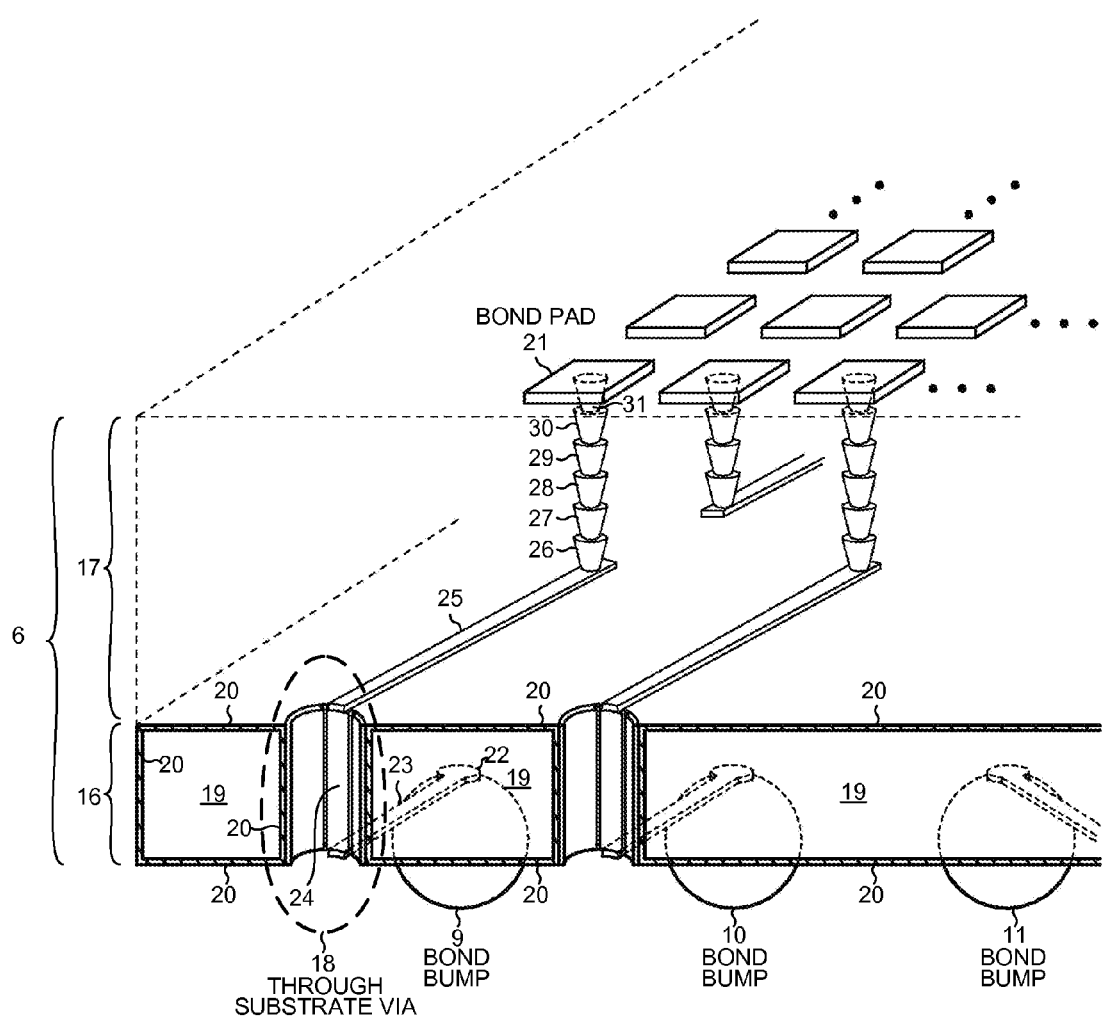
FIG. 3 is a more detailed cross-sectional diagram of the corner of the interposer in the packaged integrated circuit structure of FIG. 2.

FIG. 3 is a more detailed cross-sectional diagram of the corner of interposer 6 that includes a Through-Substrate Via (TSV) 18. Reference numeral 19 identifies the layer of monocrystalline silicon of substrate layer 16. Reference numeral 20 identifies a thin insulating layer of silicon oxide of the substrate layer 16. Reference numeral 21 identifies one bond pad of an array of bond pads. The array of bond pads is disposed on the upper surface of interposer 6. Bond bump 9 is a Controlled Collapse Chip Connection (C4) bond bump. Bond bump 9 is electrically connected to bond pad 21 through metal pad 22, a horizontally extending metal strip portion 23, a vertically extending metal strip portion 24 of the TSV structure 18, a horizontally extending metal strip portion 25, and a stack of metal plugs or vias 26-31. The stack of metal plugs 26-31 is representative of a suitable electrical connection through interconnection layer 17. In other embodiments, the connection can involve multiple other interconnection signal conductor portions and other metal plugs provided that vertically extending metal strip portion 25 is electrically connected to bond pad 21. In the illustrated example, bond bump 9 is electrically connected to only one bond pad 21, and bond pad 21 is electrically connected to only one bond bump 9. The top of horizontally extending metal strip portion 23 is insulated from the overlying silicon layer 19 by a portion of insulating layer 20. The vertically extending metal strip portion 24 is insulated from silicon layer 19 by another portion of insulating layer 19. The bottom of horizontally extending metal strip portion 25 is insulated from the underlying silicon layer 19 by still another portion of insulating layer 20.

Figure 4:
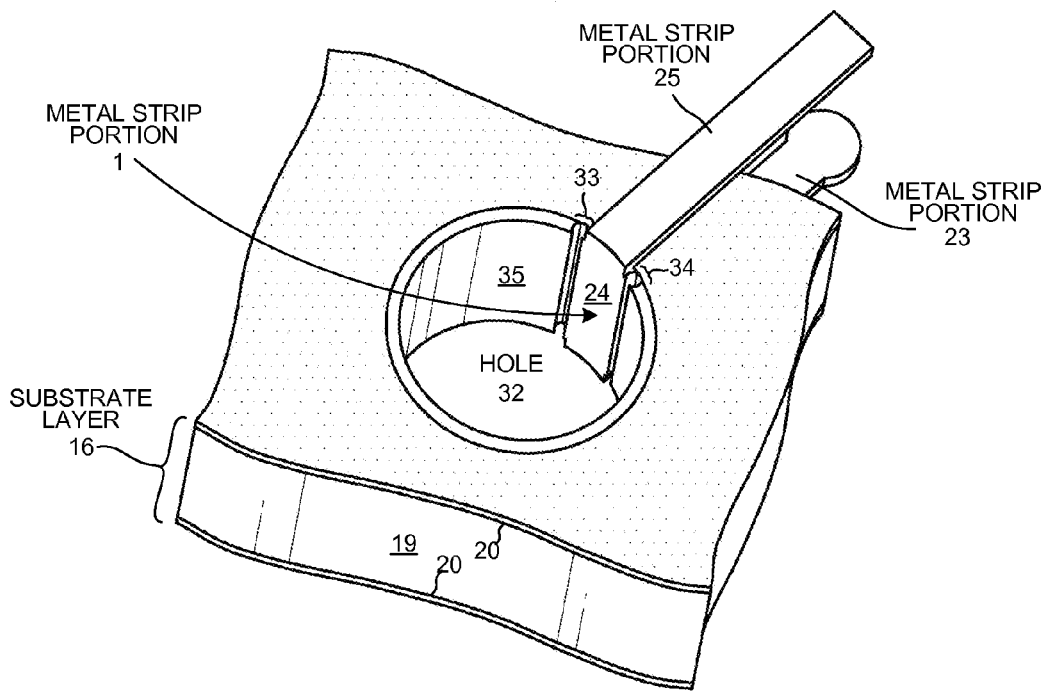
FIG. 4 is a top-down perspective view of a TSV structure in the interposer of FIG. 3.

FIG. 4 is a top-down perspective view of TSV 18. Substrate layer 16 forms a hole 32. Hole 32 extends from the upper major planar surface of substrate layer 16, all the way through the semiconductor layer 19 of substrate layer 16, and to the bottom major planar surface of substrate layer 16. In the illustrated example, hole 32 has a circular cross-section. The largest cross-sectional width of the hole is therefore its diameter. The inside sidewall surface of hole 32 has a cylindrical shape, and this surface is a cylindrical surface of insulating layer 20. A substantially cylindrical sheath of metal covers the inside cylindrical surface of the hole, except for two vertically extending narrow strip portions 33 and 34 of the insulating sidewall that are exposed and not covered by metal. First narrow strip portion 33 extends along a first edge of the vertically extending metal strip portion 24. Second narrow strip portion 34 extends along a second edge of the vertically extending metal strip portion 24. Reference numeral 35 identifies the remainder of the cylindrical sheath of metal that is disposed on the inside sidewall of hole 32. Vertically extending metal strip portion 24 is a longitudinal slice of the metal sheath. Vertically extending metal strip portion 24 is formed such that it has substantially the same width as do the horizontally extending metal strip portions 23 and 25. Not only do metal strip portions 23, 24, and 25 have the same widths, but metal strip portions 23, 24 and 25 also have substantially the same thicknesses. The thickness of the metal on the inside of hole 32 in the horizontal dimension is the same as the thickness of the metal of portions 23 and 25 in the vertical dimension. Metal strip portions 23, 24 and 25 therefore form a single metal strip of substantially uniform thickness and width that extends a first distance D1 in a direction perpendicular to the axis of the hole 32, that then turns and extends a second distance D2 along the sidewall of hole 32 in a direction parallel to the axis, and that then turns and extends a third distance D3 in a direction perpendicular to the axis of the hole 32.

Figure 5:
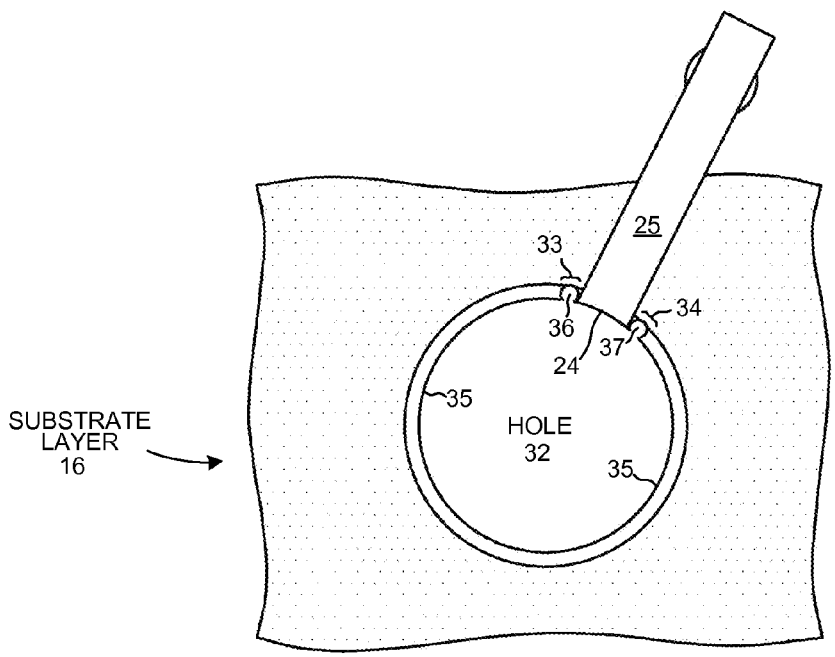
FIG. 5 is a top-down diagram of the TSV structure of FIG. 4.

FIG. 5 is a top-down diagram of TSV 18. Reference numeral 36 identifies the upper end of a first circular bore hole that defines a first vertically extending edge of metal strip portion 24. This bore hole 36 extends laterally into the insulative layer on the inside of hole 32, thereby exposing vertically extending narrow strip portion 33 of the insulative sidewall. Similarly, reference numeral 37 identifies the upper end of a second circular bore hole that defines a second vertically extending edge of metal strip portion 24. The bore hole 37 extends laterally into the insulative layer on the inside of hole 32, thereby exposing vertically extending narrow strip portion 34 of the insulative sidewall. When the TSV is considered in cross section, the center portion of hole 32 is devoid of metal.

Figure 6:
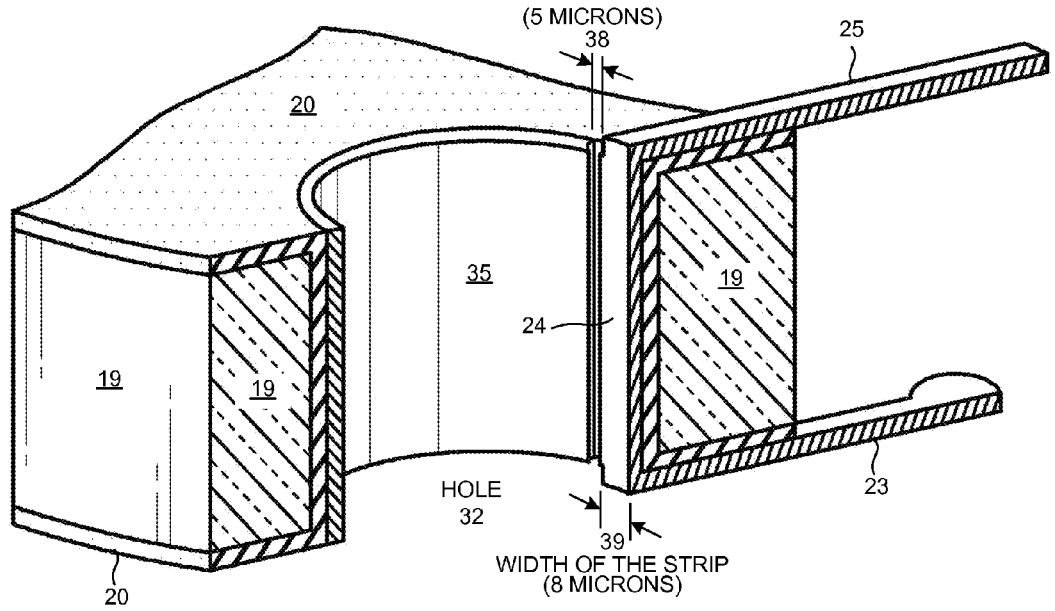
FIG. 6 is a cross-sectional perspective view of the TSV structure of FIG. 4.

FIG. 6 is a cross-sectional perspective view of TSV 18. Reference numeral 38 identifies the width of narrow strip portion 33 of the insulative sidewall that is exposed and not covered with metal. Reference numeral 39 identifies the width of the vertically extending metal strip portion 24. Width 38 is smaller than width 39. In one example, width 38 is five microns and width 39 is eight microns.

Figure 7:
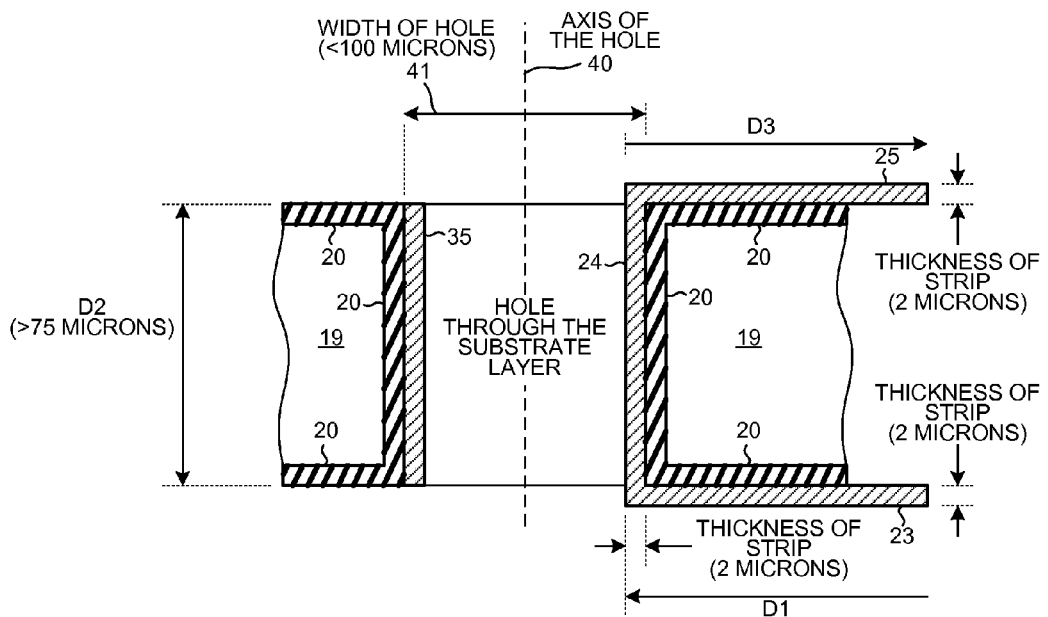
FIG. 7 is a cross-sectional diagram of the TSV structure of FIG. 4.

FIG. 7 is a cross-sectional diagram of TSV 18. Dashed line 40 indicates the axis of hole 32. In the illustrated example, the width (diameter) 41 of the hole 32 is less than one hundred microns and in one specific example is sixty microns. The hole extends all the way through substrate layer 16 for a distance of at least seventy-five microns and in the specific example this distance is two hundred microns. The metal strip involving strip portions 23-25 extends a first distance D1 in a direction substantially perpendicular to the axis 40, and then turns and extends along a portion of the sidewall of the hole 32 for a second distance D2 of at least seventy-five microns in a direction parallel to axis 40, and then turns and extends a third distance D3 in a direction substantially perpendicular to the axis 40. In the specific example, the thickness of the metal strip throughout the entire D1, D2 and D3 distance is approximately two microns. The metal is copper. Due to the uniformity of the width and thickness of the metal strip, and due to the uniformity of insulating layer 20, the metal strip is an electrical connection having a controlled constant impedance in the ten to twenty ohm range at 2 GHz.

Figure 8:
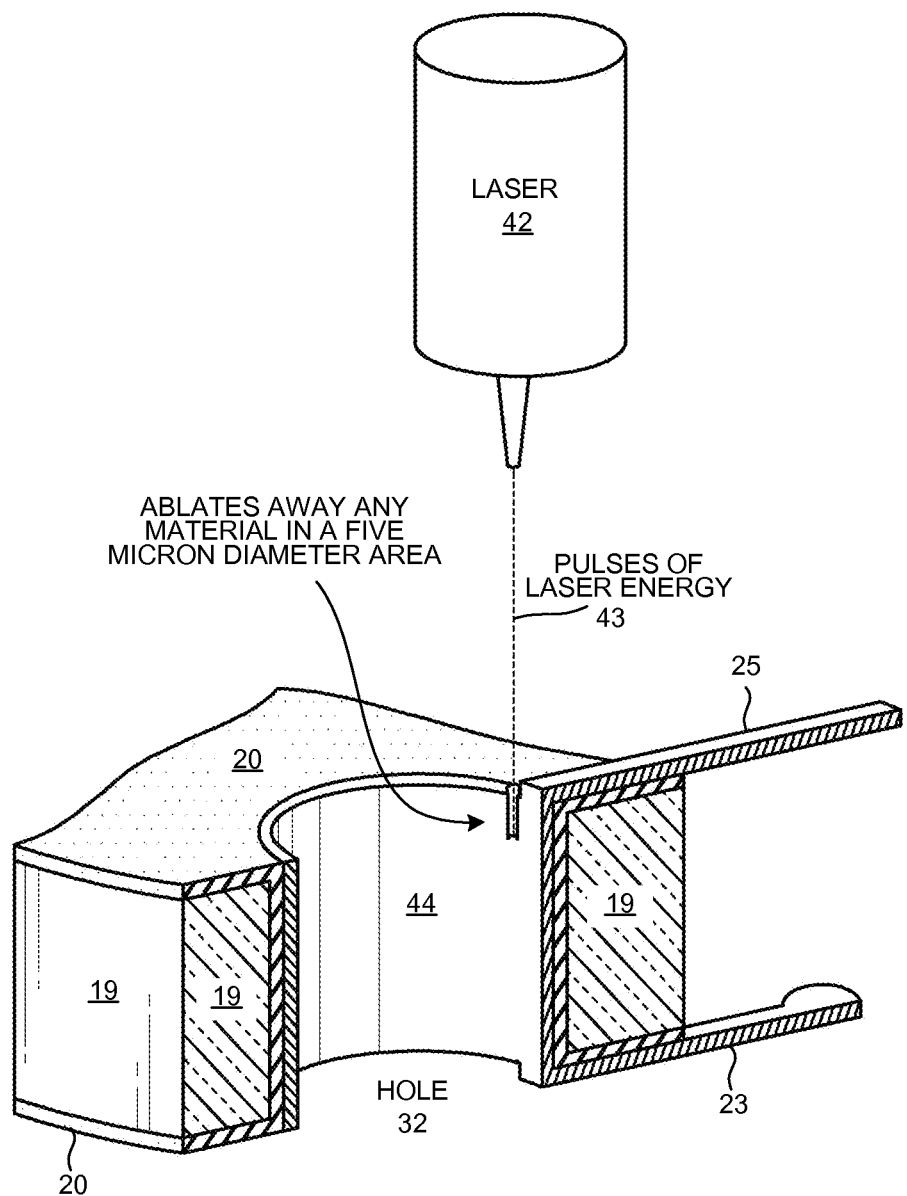
FIG. 8 is a diagram that illustrates one method of manufacturing the TSV structure of FIG. 4.

FIG. 8 is a cross-sectional perspective diagram that illustrates one way that TSV 18 can be formed. A laser 42 generates pulses of laser energy 43. Laser 42 is aligned such that the pulses of laser energy 43 ablate the bore holes 36 and 37 illustrated in the top-down diagram of FIG. 5. FIG. 8 shows bore hole 36 being formed. The laser is a UV excimer laser that emits 450 milliJoule pulses of laser energy. Each pulse is several tens of nanoseconds in duration. A pulse irradiates a five micron diameter circular area. The instantaneous peak density at the irradiated surface is about $15 \times 10^6$ Watts per square centimeter. The wavelength of the laser radiation is in a range of from about 157 nm to about 351 nm. The actual wavelength used depends on the gas composition of a gas in the laser cavity. During irradiation with a pulse, energy is coupled into the material at the surface such that a sudden increase in pressure and temperature occurs. The sudden increase in pressure and temperature in turn results in explosive removal of the surface material known as ablation. In this way, each pulse removes 0.01 to 0.1 microns of material within a five micron diameter circle. Hole 36 is bored by repeatedly irradiating the bottom of the hole with such pulses so that a five micron wide cylindrical hole gets deeper and deeper with each pulse until the hole passes all the way through the metal sheath than lines hole 32. This leaves the vertically extending exposed narrow strip portion 33 of the insulative sidewall. Similarly, hole 37 is bored by repeatedly irradiating the bottom of the hole with pulses so that the hole gets deeper and deeper with each pulse until the hole passes all the way through the cylindrical metal sheath leaving the vertically extending exposed narrow strip portion 34 of the insulative sidewall. The amount of metal remaining between the two bore holes 36 and 37 is the vertically extending strip portion 24 of the TSV. Each TSV of substrate layer 16 is formed in this way. After all TSVs have been formed, then the insulative and conductor layers of the interconnect layer 17 are formed on the substrate layer 16 by depositing a layer, patterning, depositing another layer, patterning, depositing yet another layer, patterning, and so forth. A wafer of interposers can processed together in a similar way to the way that a wafer of integrated circuits is processed, and as a last processing step the wafer can be broken up thereby forming individual interposers.

Figure 9:
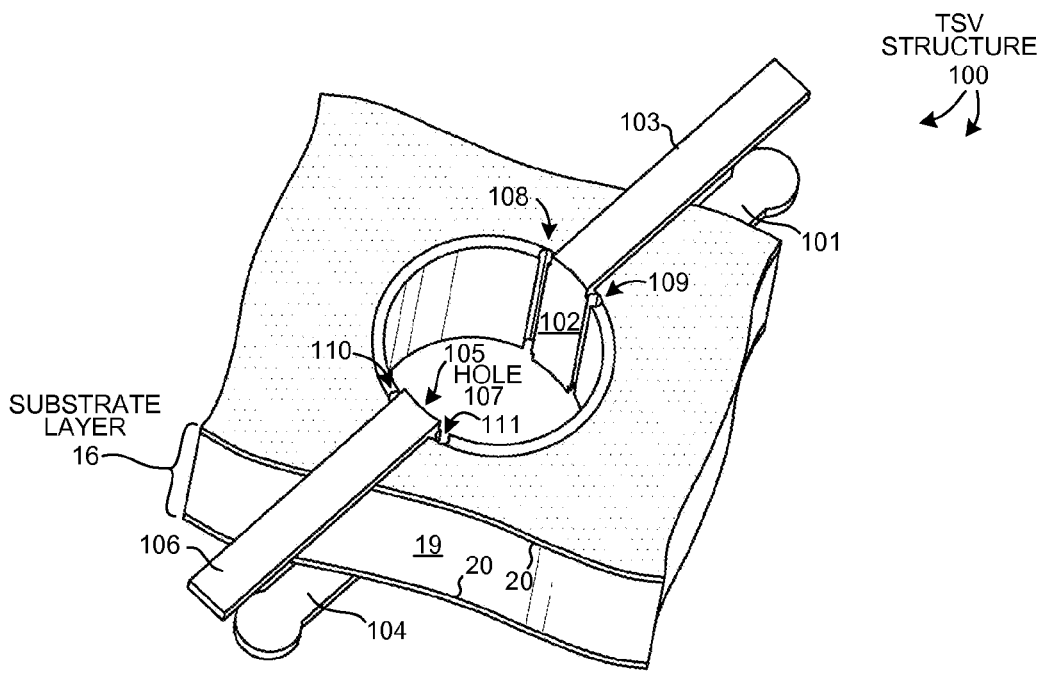
FIG. 9 is a perspective view of a TSV structure in which multiple metal strips extend through the same TSV hole in a substrate layer.

FIG. 9 is a perspective view of another TSV structure 100. TSV structure 100 is formed in much the same way that TSV 18 of FIG. 4 is formed, except that there are two metal strips 101-103 and 104-106 that pass through the same hole 107. The vertically extending strip portion 102 is formed by laser ablating two parallel-extending bore holes 108 and 109 through the cylindrical metal sheath that lines the inside of hole 107. Similarly, the vertically extending strip portion 105 is formed by laser ablating two parallel-extending bore holes 110 and 111 through the cylindrical metal sheath that lines the inside of hole 106. The resulting metal strips 101-103 and 104-106 are of the same uniform width and uniform thickness.

Figure 10:
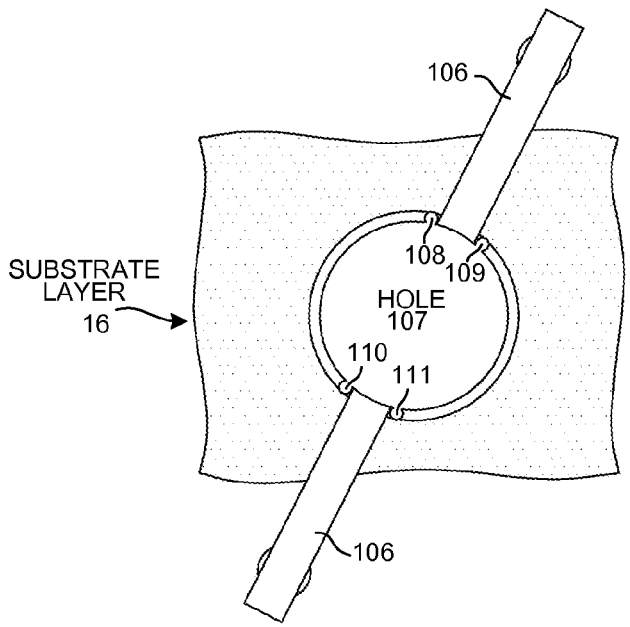
FIG. 10 is a top-down diagram of the TSV structure of FIG. 9.

FIG. 10 is a top-down diagram of the TSV structure 100 of FIG. 9.

Figure 11:
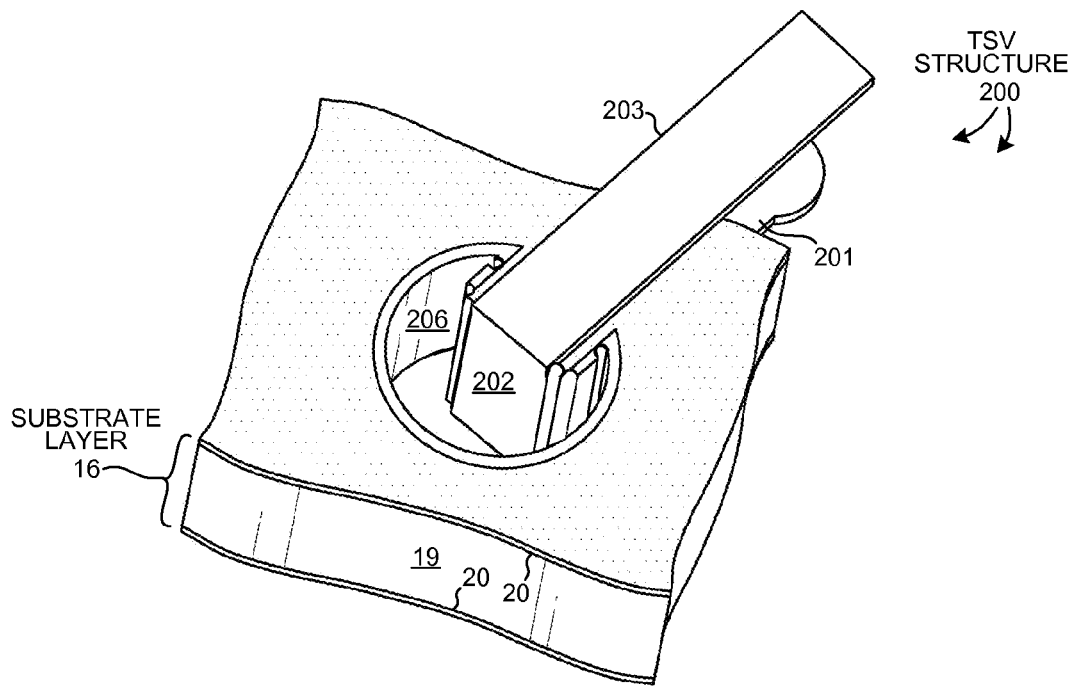
FIG. 11 is a perspective view of a coaxial TSV structure.
Figure 12:
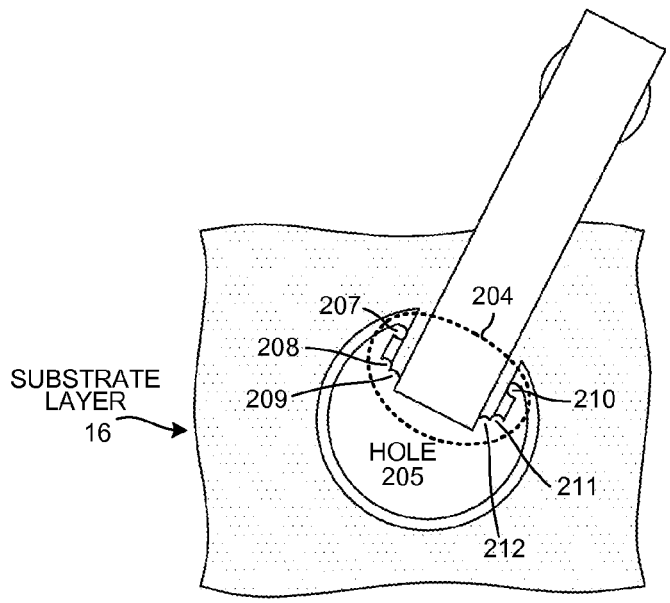
FIG. 12 is a top-down diagram of the coaxial TSV structure of FIG. 11.

FIG. 11 is a perspective view of another TSV structure 200. FIG. 12 is a top-down diagram of this TSV structure 200. TSV structure 200 is a coaxial conductor structure having a centrally and axially placed metal strip portion 202 used for conducting a signal. Metal strip 201-203 has a substantially uniform width and thickness as in the embodiments of FIGS. 4 and 9. The vertically extending strip portion 202, however, is disposed on the insulated end surface of a ledge 204 that sticks into the center of hole 205. The ledge 204 extends axially and lengthwise down the center of hole 205. In one example, the hole 205 having the ledge 204 was previously formed into the monocrystalline semiconductor layer of the substrate layer 16 by laser ablation. The hole 205 extends all the way through the monocrystalline semiconductor layer. After formation of hole 205 by laser ablation, the insulative layer 20 was formed on all exposed surfaces of the semiconductor including on inside surfaces of hole 205. Thereafter the inside of hole 205 was sheathed with a conformal layer of metal.

When the finished TSV structure 200 is viewed in cross-section, strip 202 is seen to be disposed on the end of ledge 204. The remaining amount of the metal of the sheath defines a circular arc of more than one hundred eighty degrees when the structure is considered in cross section. As illustrated in FIG. 12, this circular arc is covered with metal of the metal sheath, but this metal is not in electrical contact with the metal of the vertically extending strip 202 due to a number of vertically extending bore holes that are formed by laser ablation. In the example of FIGS. 11 and 12, there were six such bore holes 207-212 formed for this purpose. These bore holes 207-212 are oriented as illustrated in FIG. 12. By virtue of laser ablating these six holes, the portion of the conformal metal sheath that had lined the sides of the protruding ledge 204 is effectively micromachined away. The result is the metal strip 201-203 of substantially uniform width and thickness. Where this metal strip passes vertically through the substrate layer 16, the strip portion 202 is substantially surrounded by a substantially tubular metal structure on the inside surface of the hole 205.

Figure 13:
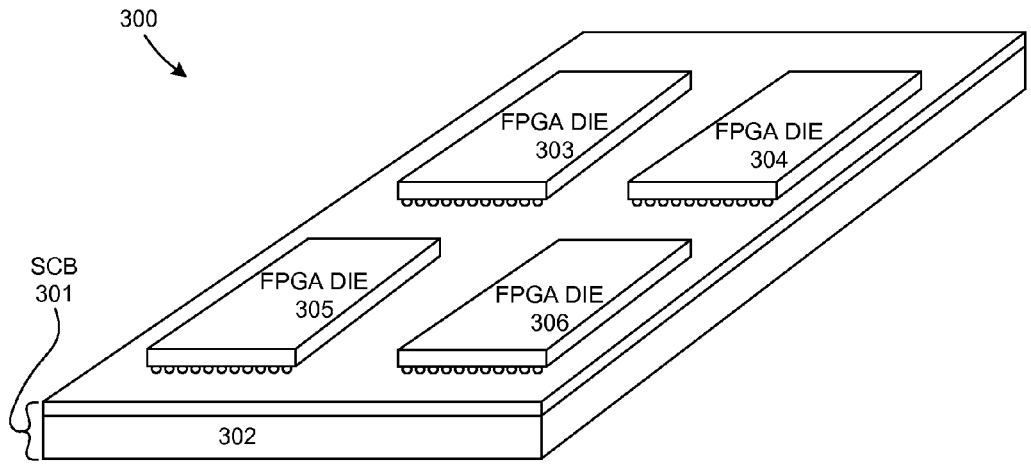
FIG. 13 is a diagram of Silicon Circuit Board (SiCB) that includes multiple TSVs in accordance with one novel aspect.

Although the TSV structures 18, 100 and 200 are described above as being part of an interposer, in another embodiment one of the TSV structures 18, 100 and 200 is a part of a Silicon Circuit Board (SiCB). FIG. 13 is a perspective diagram of a Silicon Circuit Board assembly 300 that involves one such SiCB 301. SiCB 301 includes a layer 302 of monocrystalline semiconductor material. The TSV structure (not shown) extends all the way through this monocrystalline semiconductor layer from a first major planar surface of the layer (for example, the upper surface), through the layer in a direction perpendicular to the first major surface, and to a second major planar surface of the layer (for example, the lower surface). Numerous integrated circuit dice 303-306 such as Field Programmable Gate Array (FPGA) dice are directly die-bonded to the upper surface of SiCB 301 as illustrated. In some embodiments, the SiCB includes an interconnect structure disposed on a power connection structure as set forth in U.S. Pat. No. 7,944,041, entitled "Integrated Semiconductor Substrate Structure Using Incompatible Processes", by Robert O. Conn (the entire subject matter of which is incorporated herein by reference). In such an embodiment, the layer of monocrystalline semiconductor material is part of the power connection structure.

Although the TSV structures 18, 100 and 200 are described above as parts of structures (interposers and SiCBs) that include an interconnection layer having many layers of small geometry conductors, the TSV structures 18, 100 and 200 are usable in other structures that involve no such small geometry interconnection layer. In one example, a Silicon Circuit Board (SiCB) having many plated through holes has an upper planar surface that is entirely covered by a thin layer of metal. Laser ablation is used not only to form the TSV structures by boring holes such as holes 33 and 34 of FIG. 4, but laser ablation is also used to cut away portions of the thin layer of metal thereby forming metal strip portions on the upper surface of the SiCB. A metal strip portion can be formed by ablating away two parallel extending channels of metal down to an underlying insulating layer so that the remaining metal between the channels is the metal strip portion. Such a metal strip portion formed by laser ablation can appear as portion 25 in FIG. 4 such that it is contiguous with a vertically extending strip portion of a TSV. In this way, customized metal strips can be formed on the upper surface of a customizable SiCB. There can be one such customizable thin metal layer on the upper surface of the SiCB and another such customizable thin metal layer on the bottom layer of the SiCB. Laser ablation is employed to form vertically extending metal strip portions at appropriate places in selected ones of the plated through holes.

Figure 14:
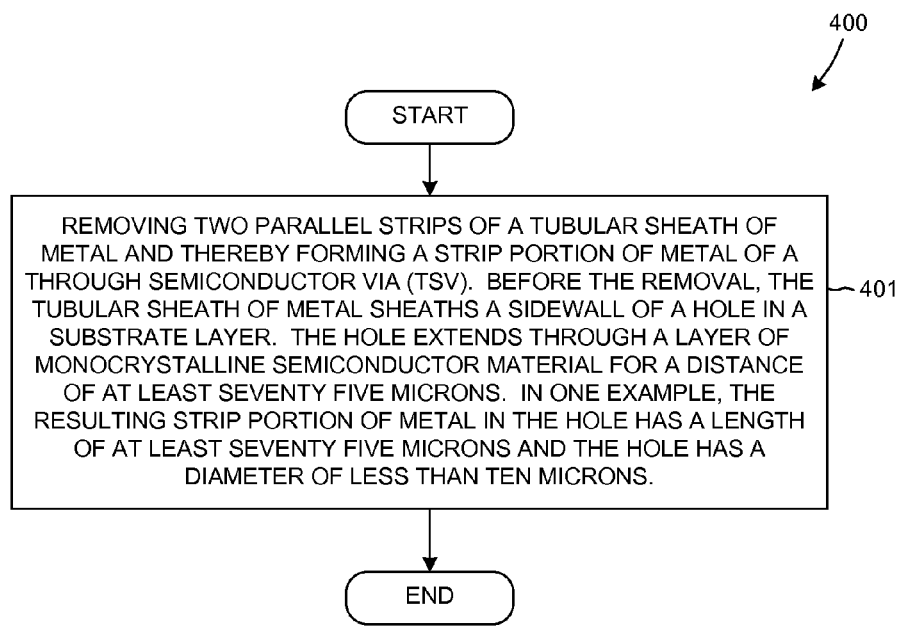
FIG. 14 is a flowchart of a method of manufacturing a TSV structure in accordance with one novel aspect.

FIG. 14 is a simplified flowchart of a method 400 of forming a TSV structure. The TSV structure is formed by removing (step 401) two parallel strips of a tubular sheath of metal, thereby forming a metal strip portion of the TSV structure. Laser ablation is usable to perform this removing step. Before the removing of the two parallel strips, the tubular sheath of metal is a substantially cylindrical layer that sheaths the inside sidewall of a hole in a substrate layer. The substrate layer includes a layer of monocrystalline semiconductor material. The hole extends all the way through the layer of monocrystalline semiconductor material for a distance of at least seventy-five microns. In one example, the resulting strip portion of metal has a length of at least seventy-five microns and the hole has a diameter of less than one hundred microns. A metal strip extends a first distance D1 in a direction substantially perpendicular to the axis of the hole, and then turns approximately ninety degrees and extends through the hole the second distance D2 of at least seventy-five microns, and then turns approximately ninety degrees and extends a third distance D3 in a direction substantially perpendicular to the axis of the hole. The metal strip has a substantially uniform width and thickness throughout distances D1, D2 and D3. In some embodiments, the width of the strip through distance D2 is slightly less (for example, 0.5 microns) than the width of the strip through distances D1 and D3 to provide a substantially constant impedance down the entire strip despite a small local increase in inductance at the junction of D1 and D2 (due to the turning of the strip from the horizontal dimension to the vertical dimension) and despite a small local increase in inductance at the junction of D2 and D3 (due to the turning of the strip from the vertical dimension to the horizontal dimension). At the locations where the strip turns, the width of the strip does not increase locally beyond the width of the horizontally extending metal strip portions. At all locations along the D1, D2 and D3 length of the overall strip, the strip is insulated from the monocrystalline semiconductor layer by an insulating layer. Even though the laser ablation TSV forming process may be slow, it may nonetheless be employed in high volume production of interposers and SiCBs by using it only in critical signal paths.

Although certain specific embodiments are described above for instructional purposes, the teachings of this patent document have general applicability and are not limited to the specific embodiments described above. Although TSV structures are described above as being formed by laser ablation of a substrate layer and then after this laser ablation subsequent layers of an interconnection layer are formed on the ablated underlying substrate layer, TSV structures can also be formed by forming an interconnect layer over a substrate layer and thereafter performing laser ablation such that bore holes are laser ablated down through the interconnect layer and then down through parts of the metal sheaths of plated through holes in the substrate layer so as to form the TSV structures. The substrate layer need not involve a monocrystalline semiconductor layer or even a semiconductor layer. Rather, the substrate layer can be a sapphire substrate layer, a ceramic substrate layer, a glass substrate layer, a plastic substrate layer, or another type of substrate layer. The TSV structure can, for example, be part of a 3D injection-molded Molded Interconnect Device (MID) substrate layer. Although the strip-shaped portions are described above for exemplary purposes as being metal, the strip-shaped portions can be made of or may involve another conductive material in some embodiments. Although various structures are described above as extending in a vertical direction, or up or down a hole, or involving an upper or top surface or a lower or bottom surface, such directional description is relational and it is understood that the described overall TSV structures can be oriented in any particular way. Accordingly, various modifications, adaptations, and combinations of various features of the described embodiments can be practiced without departing from the scope of the invention as set forth in the claims.

What is claimed is:

1. A structure comprising:
a substrate layer comprising a layer of monocrystalline semiconductor material, wherein the substrate layer forms a hole, wherein the hole extends through the layer of monocrystalline semiconductor material, wherein the hole has an axis and a width, wherein the width of the hole is less than one hundred microns; and
a metal strip that has a substantially uniform width and that extends a first distance in a direction substantially perpendicular to the axis of the hole and that then turns and extends a second distance in a direction substantially parallel to the axis along a portion of a sidewall of the hole, wherein the width of the metal strip is less than the width of the hole, and wherein second distance is at least seventy-five microns.

2. The structure of claim 1, wherein the hole has a circular cross section, wherein the sidewall of the hole has a substantially cylindrical shape, and wherein a center portion of the circular cross section of the hole is devoid of metal.

3. The structure of claim 1, wherein the metal strip has a substantially uniform thickness as it extends the first distance in the direction substantially perpendicular to the axis of the hole and then as it extends the second distance along the portion of the sidewall of the hole.

4. The structure of claim 1, wherein the sidewall of the hole is a surface of an insulating layer, wherein the insulating layer has a tubular shape, and wherein the metal strip extends along an inside sidewall surface of the tubular shaped insulating layer.

5. The structure of claim 1, further comprising:
a metal layer that covers substantially all of the sidewall of the hole except for 1) a portion of the sidewall along which the metal strip extends, 2) a first narrow strip of the sidewall that extends along a first edge of the metal strip, and 3) a second narrow strip of the sidewall that extends along a second edge of the metal strip.

6. The structure of claim 1, wherein the metal strip extends out of the hole and turns and extends a third distance in a direction substantially perpendicular to the axis of the hole, wherein the metal strip has the substantially uniform width as it extends out of the hole and as it extends the third distance.

7. The structure of claim 1, further comprising:
a plurality of bond pads; and
a plurality of integrated circuit dice that are die bonded to the bond pads.

8. The structure of claim 7, wherein the structure comprises an interconnect layer portion disposed on the substrate layer, and wherein the first distance of the metal strip is part of the interconnect layer portion.

9. The structure of claim 8, wherein the structure is taken from the group consisting of: an interposer inside an integrated circuit package, and Silicon Circuit Board (SiCB).

10. The structure of claim 1, wherein the sidewall of the hole is sheathed with a layer of metal but for two narrow strip portions of the sidewall, wherein a first of the two narrow strip portions extends along a first edge of the metal strip, and wherein a second of the two narrow strip portions extends along a second edge of the metal strip.

11. The structure of claim 1, further comprising:
a second metal strip that has the substantially uniform width and that extends a distance in a direction substantially perpendicular to the axis of the hole and that then turns and extends the second distance along the sidewall of the hole, wherein the width of the second metal strip is less than the width of the hole, and wherein the second distance is at least seventy-five microns.

12. The structure of claim 1, wherein the hole is a substantially tubular channel having a ledge that protrudes into a center portion of the substantially tubular channel, wherein the ledge has a surface that extends lengthwise along the center portion of the substantially tubular channel, and wherein the portion of the sidewall along which the metal strip extends is the surface of the ledge.

13. The structure of claim 12, wherein the sidewall of the hole in cross-section defines a circular arc of more than one hundred and eighty degrees, wherein the circular arc is covered with a layer of metal, and wherein the layer of metal that covers the circular arc is not in electrical contact with the metal strip that extends along the surface of the ledge.

14. A method comprising:
(a) using a laser to remove two parallel extending strips of a tubular sheath of metal and thereby forming a first strip portion of metal, wherein the tubular sheath prior to said removal sheaths a sidewall of a hole, wherein the hole is a hole in a substrate layer, wherein the hole has an axis and a width and extends through a layer of monocrystalline semiconductor material of the substrate layer, wherein the width of the hole is less than one hundred microns, wherein the two parallel strips of metal that are removed extend parallel to the axis of the hole for a distance of at least seventy-five microns, and wherein the removing of the two parallel strips leaves the first strip portion of metal so that the first strip portion extends along the sidewall for a distance of at least seventy-five microns; and (b) providing a second strip portion of metal that extends in a plane, wherein the plane is substantially perpendicular to the axis of the hole, wherein the first strip portion and the second strip portion together form a single strip of metal of substantially uniform width that extends a first distance in the plane and then turns approximately ninety degrees and extends along the sidewall of the hole.

15. The method of claim 14, wherein the second strip portion has a width, and wherein the single strip of metal at no point has a width greater than the width of the second strip portion.

16. The method of claim 14, wherein the second strip portion is provided in (b) before the first strip portion is formed in (a).

17. The method of claim 14, wherein the second strip portion is provided in (b) after the first strip portion is formed in (a).

18. The method of claim 14, wherein the second strip portion is formed by laser ablation.

19. The method of claim 14, wherein the laser removes the two parallel extending strips in (a) by laser ablation.

20. The method of claim 14, wherein the second strip portion has a thickness, wherein the tubular sheath has a thickness, and wherein the thickness of the second strip portion and the thickness of the tubular sheath are substantially identical.

21. The method of claim 14, further comprising:
forming a bond pad that is electrically connected to the first strip portion of metal.

22. A method comprising:
forming a metal strip that extends a first distance in a plane substantially perpendicular to an axis of a hole and that then turns approximately ninety degrees and extends a second distance along a portion of a sidewall of the hole, wherein the hole has a width that is less than one hundred microns, wherein second distance is at least seventy-five microns, wherein the metal strip has a substantially uniform width that is substantially less than the width of the hole, and wherein a center portion of the hole is devoid of metal.

23. The method of claim 22, wherein the forming of the metal strip involves laser ablation of an amount of metal from within the hole, and wherein a portion of the metal strip that extends the second distance is a longitudinal slice of a tubular sheath of metal.

24. A structure comprising:
a semiconductor substrate having a first major planar surface and a second major planar surface, wherein the semiconductor substrate forms a hole, wherein the hole extends from the first major planar surface and through the semiconductor substrate and to the second major planar surface, wherein the hole has a maximum width of less than one hundred microns;

a first metal strip portion that extends through the hole for a distance of more than seventy-five microns, wherein the first metal strip portion has a uniform width within the hole, and wherein the width is substantially less than the maximum width of the hole; and a second metal strip portion that extends in a direction parallel to the first major planar surface of the semiconductor substrate, wherein the second metal strip portion has the same uniform width as the first metal strip portion, and wherein the first and second metal strip portions together form a contiguous metal strip having the uniform width.

* * * * *